United States Patent [19]

Thomas

[11] 4,298,436
[45] Nov. 3, 1981

[54] METHOD OF FORMING INSULATED CONDUCTORS IN A CONDUCTIVE MEDIUM AND ARTICLE THUS FORMED

[75] Inventor: Lowell E. Thomas, Tewksbury, Mass.

[73] Assignee: Dynamics Research Corporation, Wilmington, Mass.

[21] Appl. No.: 158,606

[22] Filed: Jun. 11, 1980

[51] Int. Cl.³ .................... C25D 5/02; C25D 5/10; C25D 5/54
[52] U.S. Cl. ........................... 204/15; 204/38 B; 204/40
[58] Field of Search ............. 204/15, 38 B, 38 C, 204/38 E, 40

[56] References Cited

U.S. PATENT DOCUMENTS

| | | | |
|---|---|---|---|
| 3,575,824 | 4/1971 | Eide | 204/15 |
| 3,622,469 | 11/1971 | Alberts | 204/15 |
| 3,676,087 | 7/1972 | Fefferman | 204/15 |

*Primary Examiner*—T. M. Tufariello
*Attorney, Agent, or Firm*—Weingarten, Maxham & Schurgin

[57] ABSTRACT

A method of forming a monolithic structure is disclosed in which insulated conductors are embedded in a block or body of conductive material. The conductors are built up on a conductive substrate selectively coated with a dielectric layer to form oversized pads over which the conductors are to be formed. The entire structure is then provided with an overlying conductive layer to allow patterned electrodeposition in which the conductors to be embedded are built up over the pads. After the formation of one level of conductors, the previously deposited conductive layer is selectively removed between the conductors so as to leave the conductors insulated from each other and situated on the oversized pads. The conductors are then overlaid with a dielectric material so as to encase each conductor in an insulative sheath. This is followed by a masking step in which the tops of the conductors are masked off. Thereafter the original conductive substrate is built up so as to surround the sides of the encased conductors and the process is repeated so as to provide an overlying second set of embedded conductors, likewise insulated from the conductive substrate in which they are embedded. The multi-layer embedded conductor structure may be utilized as a magnetic recording head, in the formation of inductors as multiwire cables, or may be utilized as a read/write head for digital computers. The subject device may also be fabricated in the form of a magnetic transducer, used for example in rotary or linear encoders.

18 Claims, 14 Drawing Figures

METHOD OF FORMING INSULATED CONDUCTORS IN A CONDUCTIVE MEDIUM AND ARTICLE THUS FORMED

FIELD OF INVENTION

This invention relates to a monolithic structure and method of manufacture and more particularly to a method of embedding insulated conductors in a conductive block or body of material.

BACKGROUND OF THE INVENTION

Multi-level monolithic fabrication techniques have been used in the past for semiconductor devices in which impurities are diffused into silicon, germanium or other crystalline substrates, in which the substrates are in general non-conductive. However, especially for electromagnetic devices, there is a need for the provision of conductors within a conductive block in which the conductors are insulated from the block. One such application would be the fabrication of magnetic recording heads.

Magnetic recording heads have, in the past, involved the utilization of a comb-like core through which insulated wires are threaded. The utilization of the insulated wires provides for control of the magnetic head but poses the problem of manually or automatically threading the wires on the core which in general results in high manufacturing costs and less process control.

It will be appreciated that most electromagnetic devices utilize wound cores involving the separate formation of a core which is over-wound in some fashion with insulated or coated wire so as to establish the required electromagnetic function. While in the past it has been possible to form certain types of flat inductors on a substrate, it has been only with difficulty, if at all, that insulated metallic conductors have been embedded in a conductive substrate or material for any kind of three dimensionality or multi-layer configuration.

It will of course be appreciated that the ability to embed conductors which are insulated from themselves and from the surrounding conductive material has utility not only in magnetic recording heads, but also in computer storage devices. The resulting structure can also be used as a multi-conductor cable, or when properly configured, is a magnetic transducer, especially useful in rotary or linear encoders.

Of course, multi-level sets of conductors embedded in a metallic core may, when appropriately connected, form a three-dimensional coil-like structure occupying more than one plane. The ability to form such an inductor especially in a monolithic fashion, has far reaching advantages.

SUMMARY OF THE INVENTION

The ability to form a monolithic structure in which conductors are embedded in and insulated from a surrounding body or block of conductive material includes the steps of building the conductors up on a conductive substrate which has been selectively coated with dielectric pads under the positions at which the conductors to be formed are to be built up. The size of the dielectric pads are such that when the conductors are formed thereon, they will extend outwardly from the base or bottom of the conductor so as to provide a contact point to which overlying dielectric layers may be sealed such that when the conductor is finally formed, it is surrounded with an insulating sheath made up of the dielectric material.

In order to be able to build up the conductors over the dielectric paths, the entire structure is provided with an overlying conductive layer. Photoresist is then selectively applied over those portions of the overlying conductive layer which are to remain free of conductors and the conductors are thereafter built up on top of the exposed portions of the conductive layer which overlie the dielectric pads.

After the formation of one level of conductors, the previously deposited conductive layer is selectively removed between the conductors so as to leave the conductors insulated from each other and situated on the aforementioned dielectric pads. Thereafter the conductors are overlaid with a dielectric material so as to encase each conductor in an insulating sheath. Thereafter the original conductive substrate is built up as by dip coating or electrodeposition so as to surround the sides of the encased conductors. The process may be repeated so as to provide an overlying second set of embedded conductors, likewise insulated from the conductive substrate in which they are embedded.

The result is multiple layers of embedded conductors, which conductors are insulted both from themselves and from the surrounding body of conductive material. With appropriate patterning, the structure can approximate the conventional magnetic stylus write head for hard copy devices such as line printers, copiers, etc. which a comb-like core is in essence provided with insulated conductors between the teeth.

Additionally, appropriately configured multi-layer devices can be used as read/write heads for disc, tape or drum storage for digital computers where density can be increased by smaller geometry.

Alternatively, by slant wise connection of the various conductors, assuming the conductors to have been formed in superimposed rings with slots at one side, the structure will resemble that of a three dimensional coil and may be used for any purpose for which inductors are normally used.

DESCRIPTION OF THE DRAWINGS

The invention will be more fully understood from the following detailed description taken in conjunction with the accompanying drawings in which.

DETAILED DESCRIPTION

Figure 1:
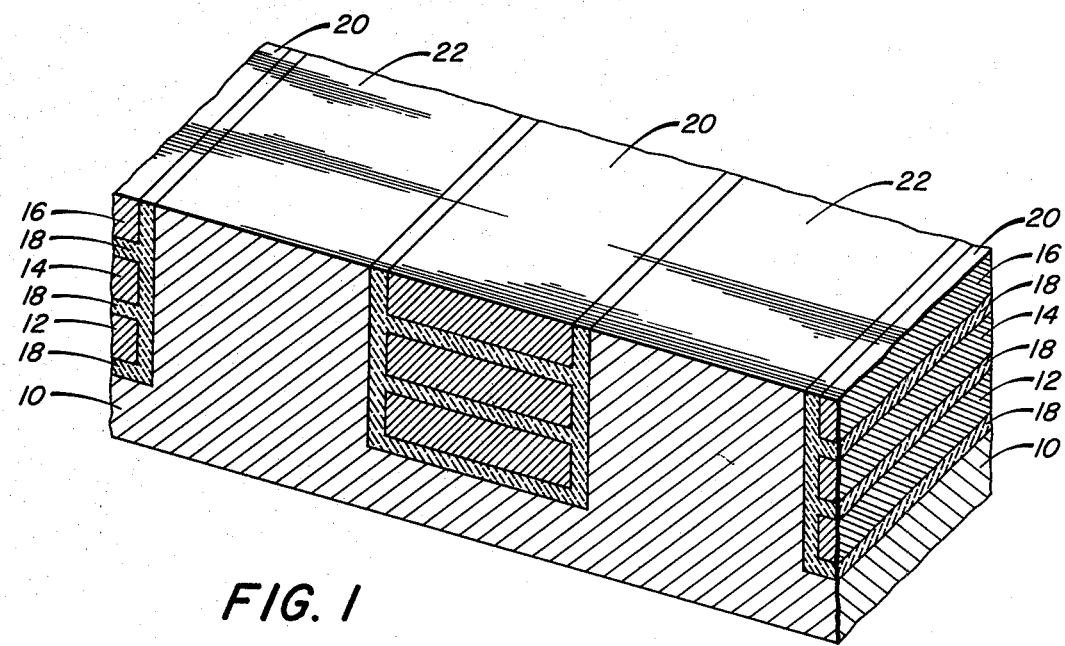
FIG. 1 is a cross-sectional and isometric view of the subject monolithic structure illustrating the embedding of three superimposed conductors in a conductive substrate.

Referring now to FIG. 1, a body or block of conductive material 10 may have embedded in it a plurality of conductors 12, 14 and 16 in which conductors 12 and 14 are completely encased or encapsulated through the utilization of dielectric material 18. As illustrated, conductor 16 may have an exposed surface 20 which is coplanar with an exposed surface 22 of substrate 10. Alternatively, conductors 16 may be completely embedded.

If, for instance, the device is to have utility in the electromagnetic area, substrate 10 can be of a ferromagnetic material such as iron or nickel-iron.

Figure 2:
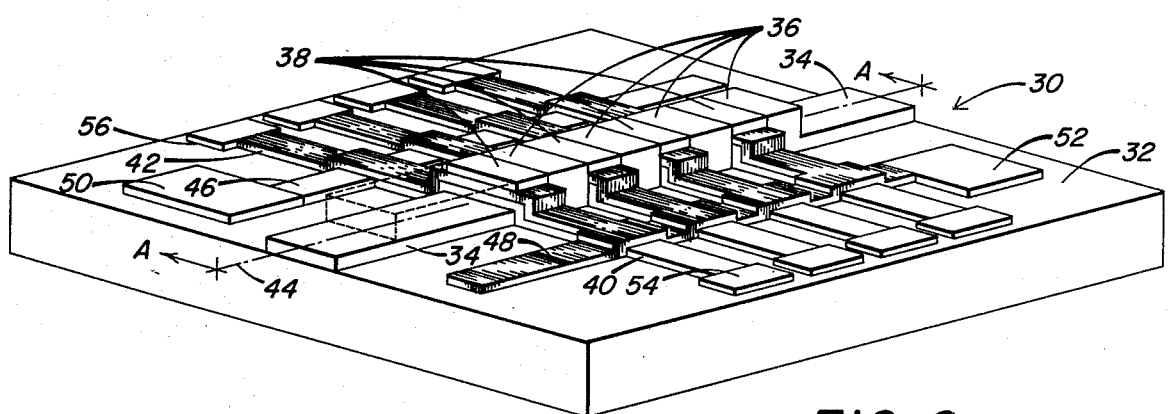
FIG. 2 is a diagrammatic illustration of one embodiment of the subject invention in which a magnetic stylus write head is manufactured in monolithic form; and, FIGS. 3A–3L illustrate one embodiment of a method utilized in forming a multi-level monolithic structure in which conductors are insulated from and embedded in a conductive substrate.

Referring now to FIG. 2, the structure illustrated in FIG. 1 may be utilized in the formation of a magnetic write head 30 which includes a non-conductive substrate 32 which may be any type of printed circuit board material and, if to be flexible, may be made of Kapton or other plastic material. The core of the head is illustrated at 34 which, as will be seen in the finished product, involves being formed with a comb-like head structure such that interstices or teeth 36 rise up from the plane of the core and are interspersed or interdigitated between control zone 38, as illustrated.

In the embodiment illustrated, each control zone includes two conductors 40 and 42 which in the region illustrated by center line 44 are stacked one on top of the other and are insulated both from each other and from core 34. An extension of conductor 40 provides for a ground bus 46 for corresponding conductors, whereas an extension of conductor 42 forms a ground bus 48 for diametrically oppositely running conductors. It will be appreciated that buses 46 and 48 are also formed with an encasing insulation which encasing insulation is stripped away to form pads 50 and 52 respectively. Likewise for conductors 40 and 42, pads 54 and 56 have insulation stripped away thereby to permit connection to the head. For a single control zone, the cross-section of the core/overlying conductor structure, is as illustrated in FIG. 1 and more specifically is illustrated in FIG. 3L.

It will be appreciated that the head of FIG. 2 is but one type structure which takes advantage of the ability to embed insulated conductors in a conductive block or body and is described for illustration purposes only.

Figure 3A:
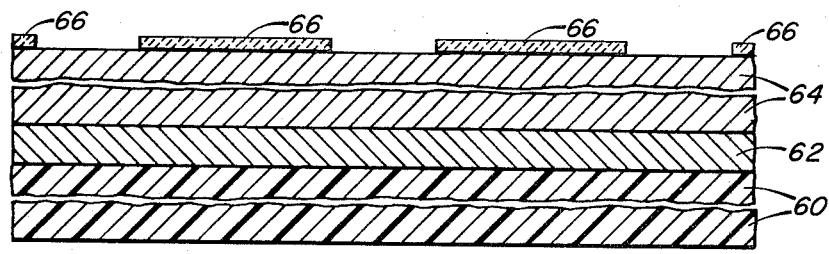

Referring now to FIG. 3A, the monolithic structure described may be formed or built up as follows. In one embodiment it is possible to start with a nonconductive substrate 60 which may be either flexible or rigid, to which is applied a thin layer of conductive metal 62, for example, copper foil. This conductive metal layer may be bonded to the top surface of non-conductive substrate 60. This structure may then be selectively electroplated by masking and emersion in a conventional electroplating bath of a metal chosen for the specific characteristics desired. This results in a conductive base 64 being formed on thin layer 62, with base 64 being chosen, for example, to have a certain magnetic reluctance. It will be appreciated that base 64 is bonded to the exposed areas of the thin conductive layer at which point a formerly used resist mask (not shown) may be removed to leave conductors of the chosen metal on the surface of the foil-coated substrate. Layers 60-64 now form a composite substrate.

Figure 3B:
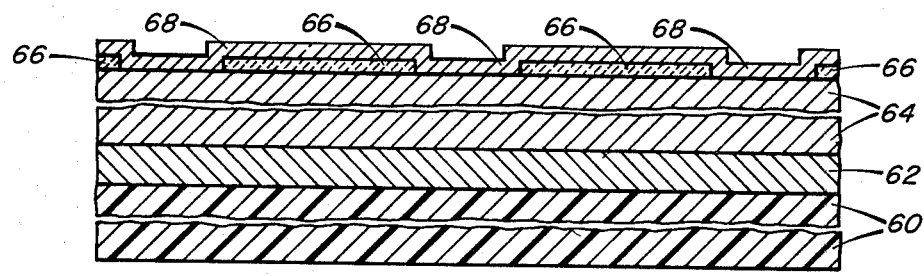

The composite substrate is now ready for the application of separate insulated conductors or conductive elements which will be embedded in contiguous metal of the chosen type. These separate insulated conductors are fabricated in layers and can be stacked to several stages high. In order to build up these conductors, base 64 is provided with dielectric pads 66 which are slightly larger than the desired bottoms or bases of the insulated conductors to be formed. This step is performed by either photo-etching a deposited dielectric layer applied to the entire surface or by stenciling. The next step, as illustrated in FIG. 3B is to overcoat the entire surface with a thin metal conductor 68 by vacuum deposition or the like.

Figure 3C:
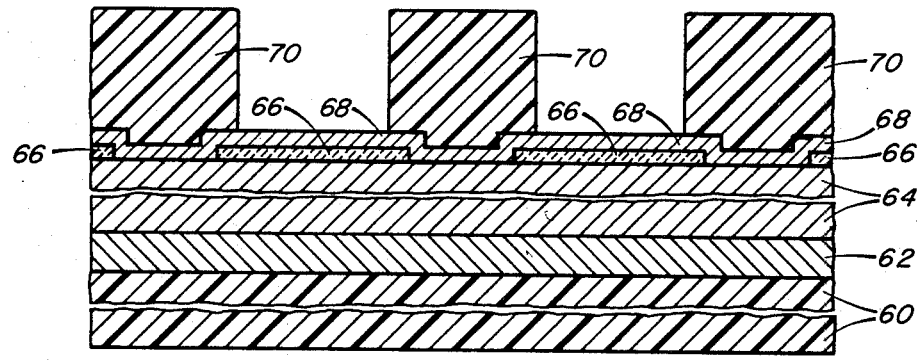

As illustrated in FIG. 3C, a thick patterned photoresist layer 70 is now superimposed over the gaps between the dielectric pads with a slight overlap onto the pads.

The thickness of the photoresist layer corresponds to the thickness of the conductors to be built up.

Figure 3D:
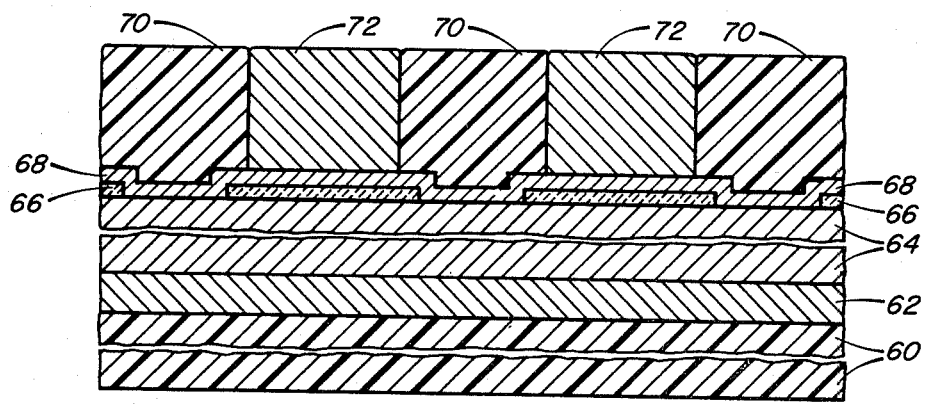

As illustrated in FIG. 3D, the part is now immersed in a conventional electroplating bath and metal such as copper is applied to the exposed areas of the thin metal conductors so as to form conductors 72, with the purpose of metal layer 68 being to permit the electrodeposition process to take place. It will be appreciated that the metal is plated to the same thickness as resist layer 70.

Figure 3E:
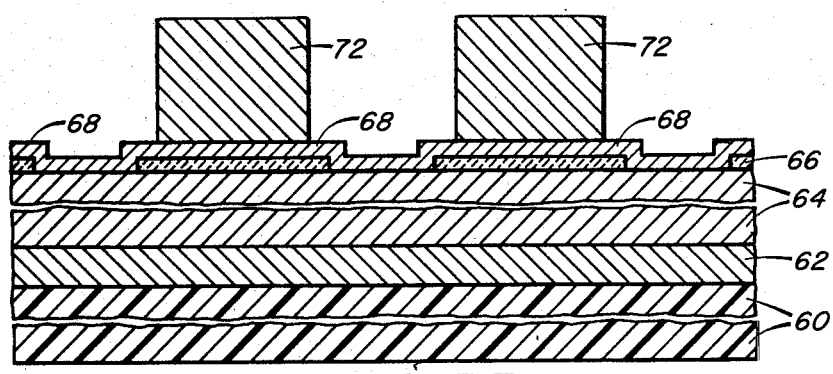

As illustrated in FIG. 3E, thick resist 70 is dissolved away which now exposes the thin conductive layer 68 between conductors 72.

Figure 3F:
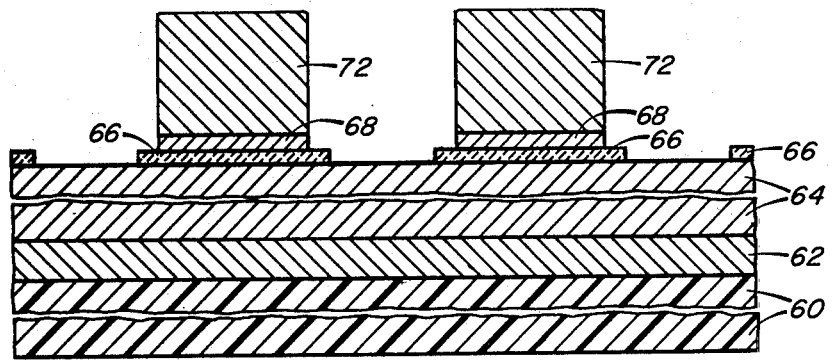

As illustrated in FIG. 3F, a portion of the layer 68 not lying under any conductor 72 is etched away by virtue of immersing the entire structure in an etching bath which slightly attacks the top portions of conductors 72 but more importantly dissolves away the rather thin layer 68 between the conductors. Alternatively, a etching step may be utilized in which the acid preferentially attacks layer 68 as opposed to conductors 72.

Figure 3G:
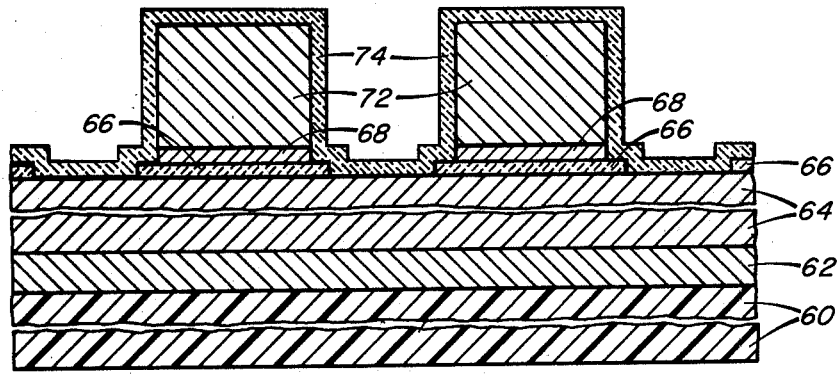

As illustrated in FIG. 3G, the entire structure is overcoated with a dielectric layer 74 which also adheres to the previously laid down dielectric pad 66, thereby to encase conductors 72 in a dielectric surround of material.

Figure 3H:
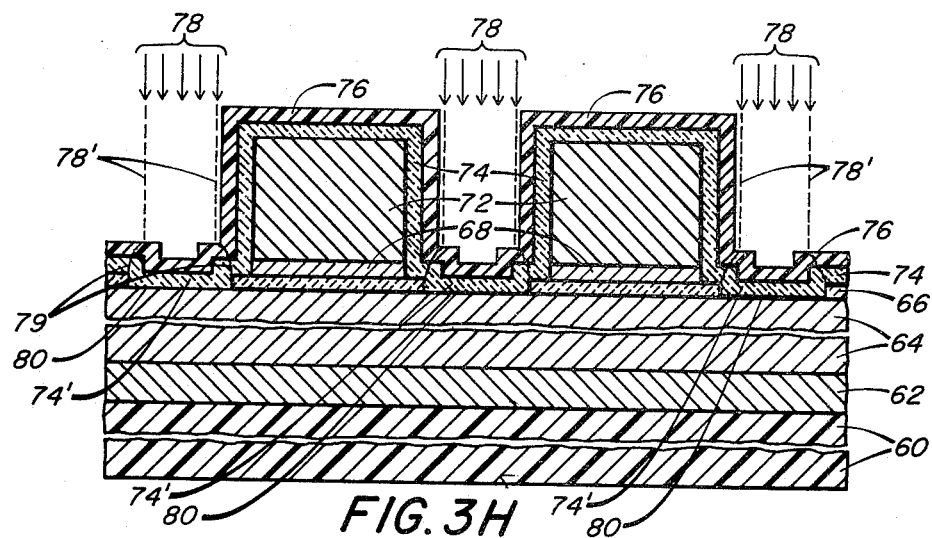

Referring to FIG. 3H, a thin layer of photoresist 76 is then overcoated as illustrated and the photoresist is imaged selectively as illustrated by arrows 78 which corresponds to imaging light coming through a mask (not shown). One type of photoresist is of such a nature that only exposed sections will be removed by developing.

Figure 3I:
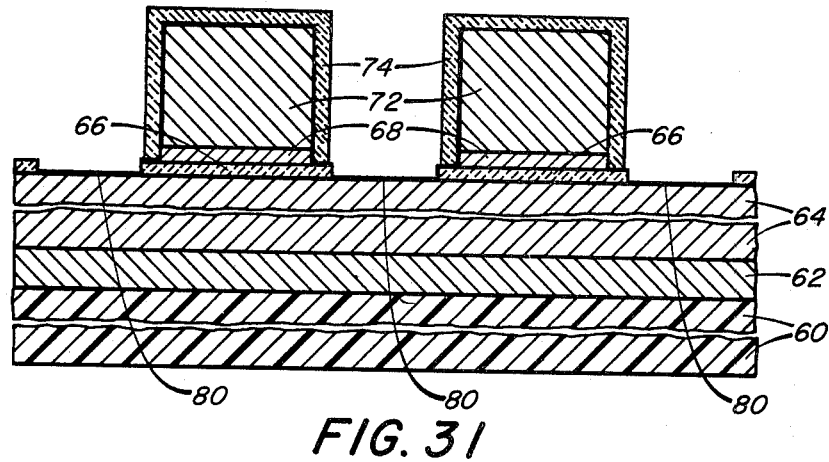

When the photoresist is developed off, the same solvent attacks the dielectric layer thereunder so as to yield the structure shown in FIG. 3I with portions 80 of base 64 exposed between coated conductors 72.

More specifically as illustrated in FIG. 3H, photoresist layer 76 is irradiated between dotted lines 78'. This may be an off contact proximity exposure utilizing a positive resist.

The resist is then developed away where exposed, with continued impingement of the developer etching away the dielectric layer immediately below the exposed photoresist. The exposed portion of the photoresist is designated 74' and the to-be-exposed portion of the base is designated 80.

As can be seen by lines 79, and the developing etchant single step, the developing-etchant undercuts or spreads out from the exposed area although this is not critical.

Due to the undercutting, a regular structure such as illustrated in FIG. 3I is formed without a large amount of dielectric layer overlap.

After the devloping step, the remainder of the photoresist is removed by a solvent (not shown).

Thus in a single step the photoresist is exposed and both the photoresist and the dielectric layer is patterned. Alternatively the dielectric could be separately etched in a selective process or a negative type resist could be used.

Figure 3J:
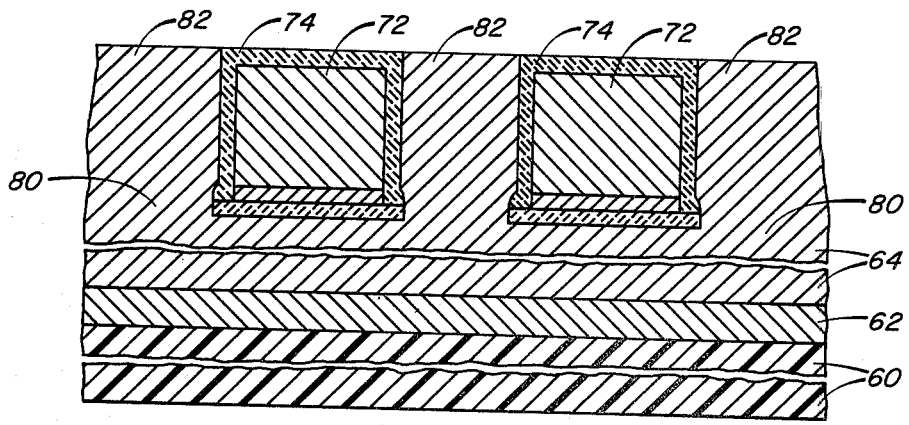

As illustrated in FIG. 3J, conductive substrate 64 is selectively built up in areas 80 in an electroplating process so as to form interdigitated portions 82 between insulated conductors 72.

Figure 3K:
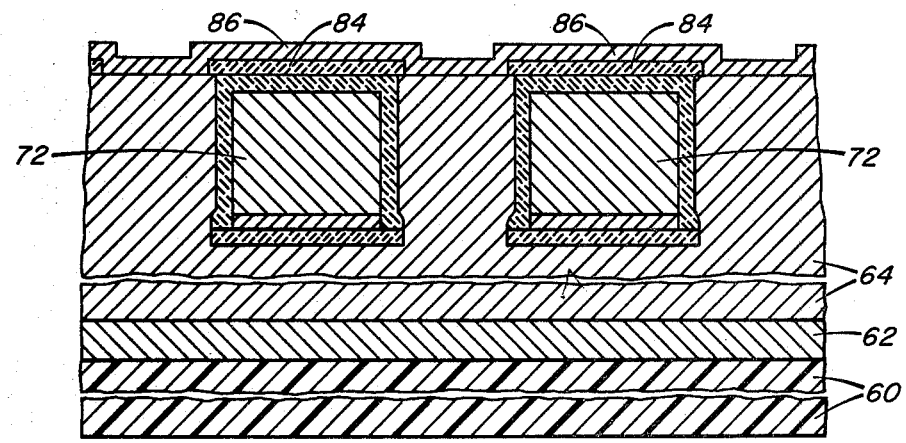
Figure 3L:
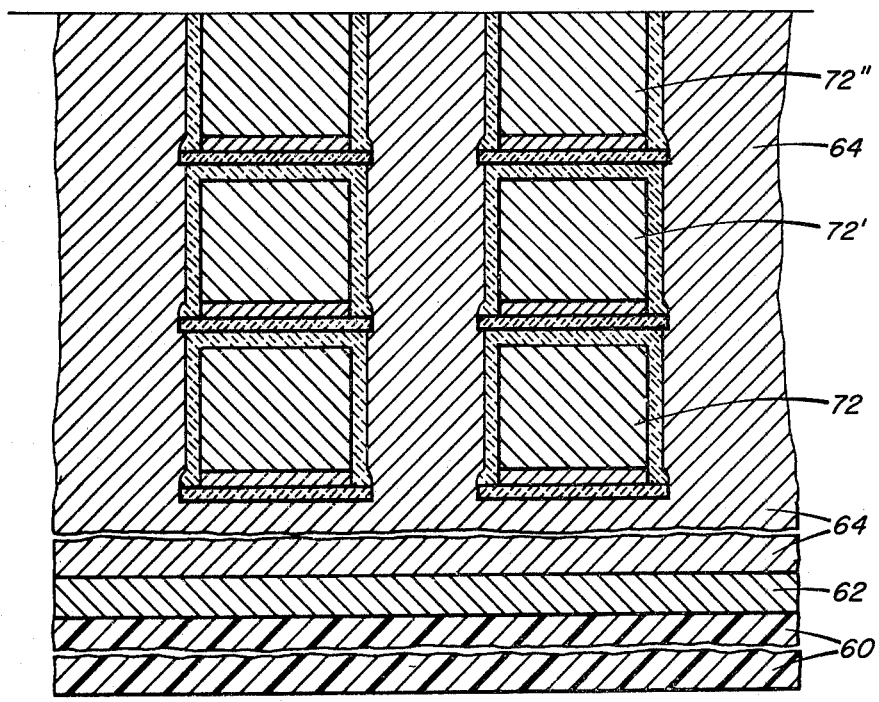

Thereafter, as illustrated in FIG. 3K, additional pads 84 are formed above conductor 72 and again a thin metallic overlayer 86 is formed so that, as illustrated in FIG. 3L, when the process is repeated a finished structure having embedded conductors 72, 72′ and 72″ are formed in a built up portion of substrate 64.

It will be appreciated that the encasing of the conductors is done through the utilization of an over-sized dielectric layer or pad which is over-coated so as to permit the build up of a conductor through electrodeposition techniques. The patterned conductor is then overlaid with a further dielectric layer which joins the pad thereby completely surrounding the conductor while insulating it not only from the base to be built up but also from further overlying conductors.

Having above indicated a preferred embodiment of the present invention, it will occur to those skilled in the art that modifications and alternatives can be practiced within the spirit of the invention. It is accordingly intended to define the scope of the invention only as indicated in the following claims.

What is claimed is:

1. A method for providing insulated conductive elements in a body of conductive material comprising the steps of:
   providing a conductive substrate with oversized pads of dielectric material at positions over which the conductive elements are to be formed;
   forming the conductive elements on the oversized pads, such that portions of the pads extend outwardly from the bottoms of the conductive elements;
   coating the tops and sides of the conductive elements with dielectric material such that the dielectric material is sealed to the portions of the oversized pads extending from the bottoms of the conductive elements; and,
   building up the substrate so as to at least surround the sides of said conductive elements.

2. The method of claim 1 wherein the step of forming the conductive elements includes the steps of:
   overcoating the substrate and dielectric pads with a layer of conductive material;
   masking off sections of the layer of conductive material at intermediate locations at which the conductive elements are to be built up with a material having a thickness approximating the thickness of the conductive elements to be built up;
   building up said conductive elements in the areas intermediate the masked off sections to a level commensurate with the top surface of the masking material; and,
   removing the masking material and portions of the conductive layer between the built up conductive elements.

3. The method of claim 2 wherein the building up step includes a step of electroforming utilizing the conductive layer as an electrode.

4. The method of claim 2 wherein the building up step includes the step of coating up the conductive elements on top of the portions of the conductive layer exposed during the masking-off step.

5. The method of claim 1 wherein the coating step includes the steps of overcoating the formed conductive elements with a layer of dielectric material; and,
   removing portions of the dielectric material intermediate said oversized pads.

6. The method of claim 5 wherin the removing step includes overlying the entire structure with a layer of photoresist, the developer for which attacks both an exposed portion of the photoresist and the layer of dielectric material;
   exposing the photoresist in areas intermediate the oversized pads;
   developing the exposed photoresist so as to remove the portions of the layer of dielectric material under the exposed portions of photoresist; and,
   removing the remaining unexposed photoresist.

7. The method of claim 1 and further including repeating the steps of claim 1, with the structure formed in claim 1 forming the substrate for the repeated steps, so as to provide an additional layer of embedded insulated conductive elements.

8. The product formed by the process of claim 1.
9. The product formed by the process of claim 2.
10. The product formed by the process of claim 3.
11. The product formed by the process of claim 4.
12. The product formed by the process of claim 5.
13. The product formed by the process of claim 6.
14. The product formed by the process of claim 7.
15. The method of claim 1 and further including the step of forming said conductive substrate on a flexible substrate.
16. The method of claim 15 wherein said flexible substrate is plastic.
17. The product formed by the process of claim 15.
18. The product formed by the process of claim 16.

* * * * *